(12) United States Patent
Torin et al.

(10) Patent No.: US 7,010,443 B2
(45) Date of Patent: Mar. 7, 2006

(54) NOISE MEASUREMENT SYSTEM AND METHOD

(75) Inventors: Shigetsune Torin, Santa Rosa, CA (US); Kenneth H. Wong, Santa Rosa, CA (US); David VerNon Blackham, Santa Rosa, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 78 days.

(21) Appl. No.: 10/699,526

(22) Filed: Oct. 31, 2003

(65) Prior Publication Data

US 2005/0096859 A1    May 5, 2005

(51) Int. Cl.
  *G01R 29/26* (2006.01)
(52) U.S. Cl. ........................... 702/69; 324/614
(58) Field of Classification Search ............ 702/75, 702/76, 60, 66, 69, 111, 124, 126, 189, 191, 702/193, 195; 324/613, 614; 375/316, 346; 333/17.1, 132
See application file for complete search history.

(56) References Cited

U.S. PATENT DOCUMENTS

| | | | |
|---|---|---|---|
| 4,864,218 A * | 9/1989 | Leake et al. ............ 324/613 |
| 5,416,422 A * | 5/1995 | Dildine ................... 324/614 |
| 5,619,536 A * | 4/1997 | Gourgue .................. 375/316 |
| 5,638,034 A * | 6/1997 | Heikkila et al. ......... 333/17.1 |
| 5,926,513 A * | 7/1999 | Suominen et al. ....... 375/346 |
| 2003/0034857 A1 * | 2/2003 | Chen ...................... 333/132 |
| 2004/0039540 A1 * | 2/2004 | Nagasaka ................ 702/69 |

FOREIGN PATENT DOCUMENTS

GB    2234874 A   *  2/1991

OTHER PUBLICATIONS

Library Of Congress Cataloging-In-Publication Data, Charles W. Therrien—"Discreet Random Signals And Statistical Signal Processing"; c 1992 by Prentice-Hall, Inc.; pp. 518-523.

* cited by examiner

*Primary Examiner*—Marc S. Hoff
*Assistant Examiner*—Mohamed Charioui
(74) *Attorney, Agent, or Firm*—John L. Imperato

(57) ABSTRACT

Noise power is measured within one or more designated frequency bands of an applied signal. The measurement includes frequency translating the applied signal by a set of equally spaced frequencies to form a corresponding set of intermediate frequency signals, measuring the noise in at least two measurement bands of each of the intermediate frequency signals that are separated by the frequency spacing of the equally spaced frequencies, and determining the noise power in the designated frequency band of the applied signal based on the noise measurements.

17 Claims, 7 Drawing Sheets

Local Oscillator @ frequencies $f_1, f_2, f_3$

NOISE MEASUREMENT SYSTEM AND METHOD

BACKGROUND OF THE INVENTION

One measure of the integrity of a communication system is the amount of noise present within the system. Characterizing the noise of a communication system involves measuring noise power within one or more specified frequency bands, shown for example in the exemplary noise spectrum of FIG. 1. Measuring noise power, in turn, involves measuring or estimating the statistics of the noise, which is inherently random.

A conventional noise figure meter (shown in FIG. 2) provides accurate measurements of noise power within a designated frequency band. In the noise figure meter, noise within the frequency band is down-converted and measured by a noise power detector. Because the noise figure meter includes multiple frequency conversion stages, the noise figure meters are typically expensive to manufacture.

Conventional direct conversion receivers (shown in FIGS. 3A–3B) are also used to measure noise power. A direct conversion receiver is typically less expensive to manufacture than a noise figure meter because the receiver includes only a single frequency conversion stage. The direct conversion receiver converts the noise within a frequency band (for example, frequency band c shown in FIG. 3C) to a baseband noise signal (shown in FIG. 3D) that is measured by a noise power detector (as shown in FIG. 3A) or by a narrow-band analog-to-digital converter (as shown in FIG. 3B). However, these direct conversion receivers are not as accurate as noise figure meters. One measure of error, the variance of the measured noise power, is substantially higher for the direct conversion receiver than for the noise figure meter. For example, the variance of the noise power measured by a typical direct conversion receiver is approximately twice as great as the variance of the noise power measured by a noise figure meter.

An alternative approach to noise power measurement is shown in FIG. 4A. In this approach, a frequency conversion stage causes upper and lower noise sidebands to overlap within a single measurement band B. FIGS. 4B–4D show these overlapping noise sidebands within the single measurement band B as a local oscillator within the frequency conversion stage is stepped in frequency between frequencies $f_1$, $f_2$ and $f_3$. A noise power detector then measures the noise power in the single measurement band B, with the local oscillator at each of the stepped frequencies. While this approach can take advantage of low-cost signal processing to extract the noise power in a designated frequency band (for example, frequency band c) based on the overlapping noise sidebands, measurement accuracy is not as good as that of the conventional noise figure meter. For example, the variance of the noise power measured using this approach is approximately three times as great as the variance that results when noise power is measured using a conventional noise figure meter.

In view of the above, there is a need for an accurate noise measurement system that does not rely on the multiple frequency conversion stages of a noise figure meter.

SUMMARY OF THE INVENTION

A noise measurement system according to embodiments of the present invention measures noise power within one or more designated frequency bands of an applied signal. The noise measurement system includes a frequency converter that frequency translates the applied signal by a set of equally spaced frequencies to form a corresponding set of intermediate frequency signals. A sampler in the noise measurement system measures the noise in at least two measurement bands of each of the intermediate frequency signals that are separated by the frequency spacing of the equally spaced frequencies. The noise measurement system also includes a signal processor that determines the noise power in the designated frequency band of the applied signal based on the noise measurements by the sampler. Alternative embodiments of the present invention are directed to a noise measurement method.

DETAILED DESCRIPTION OF THE EMBODIMENTS

Figure 1:
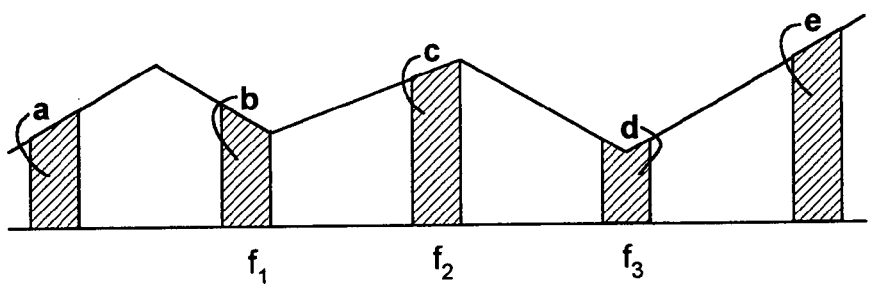
FIG. 1 shows a series of frequency bands within an exemplary noise spectrum.
Figure 2:
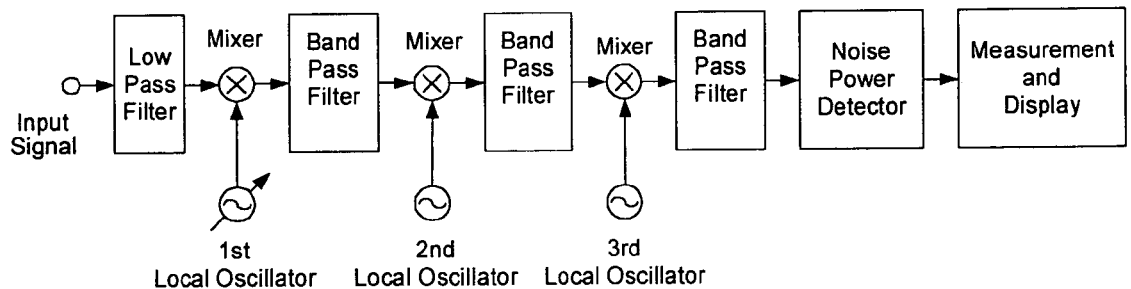
FIG. 2 shows a conventional noise figure meter.
Figure 3A:
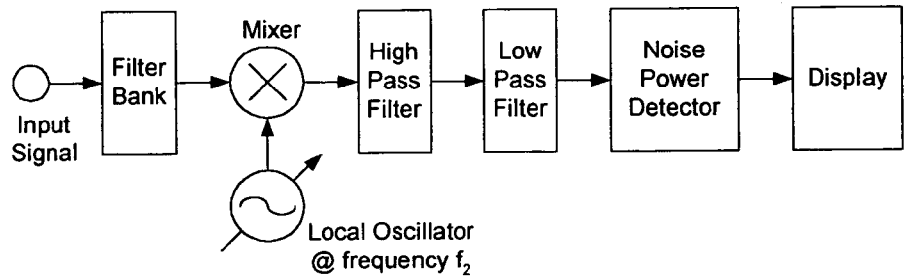
FIGS. 3A–3D show conventional direct conversion receivers and associated measurement noise spectra.
Figure 3B:
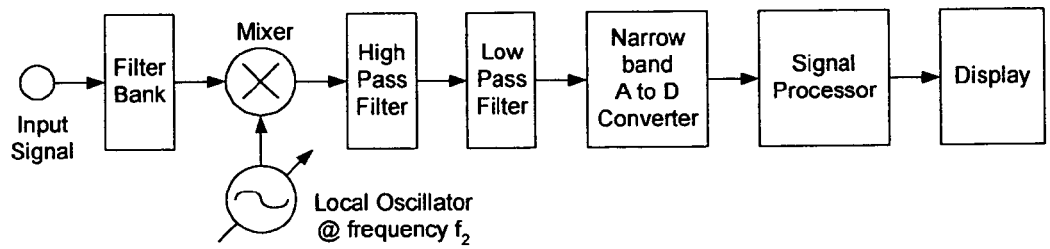
Figure 3C:
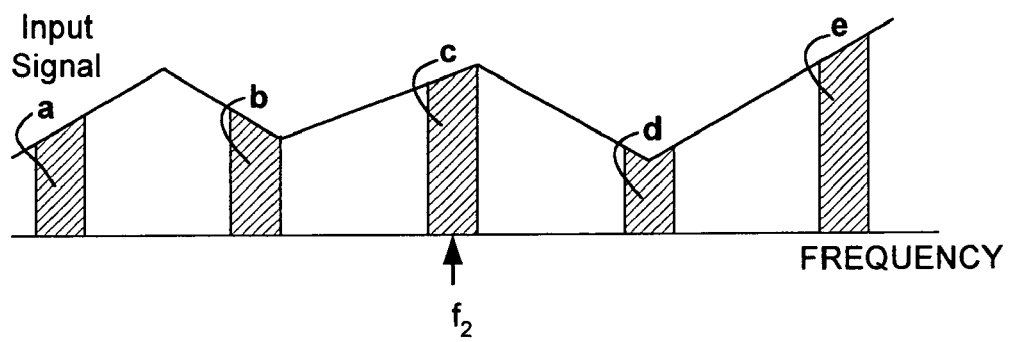
Figure 3D:
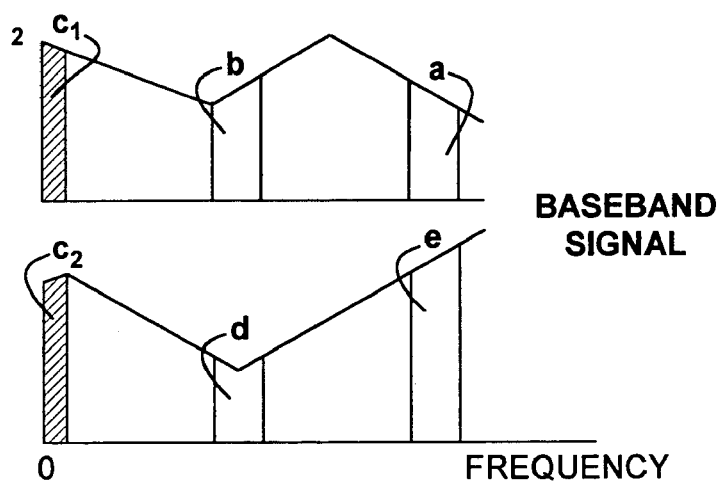
Figure 4A:
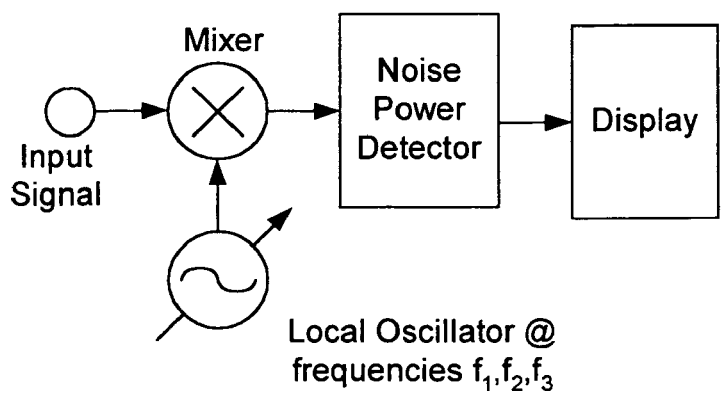
FIGS. 4A–4D show alternative conventional noise measurement receivers and associated measurement noise spectra.
Figure 4B:
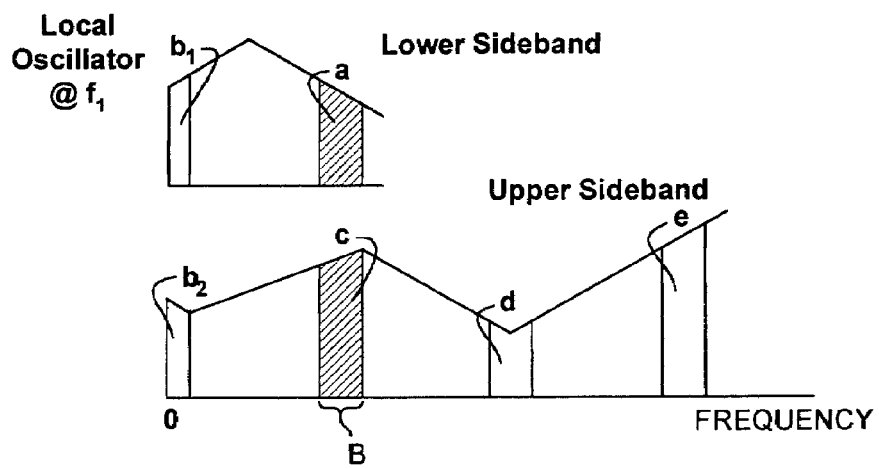
Figure 4C:
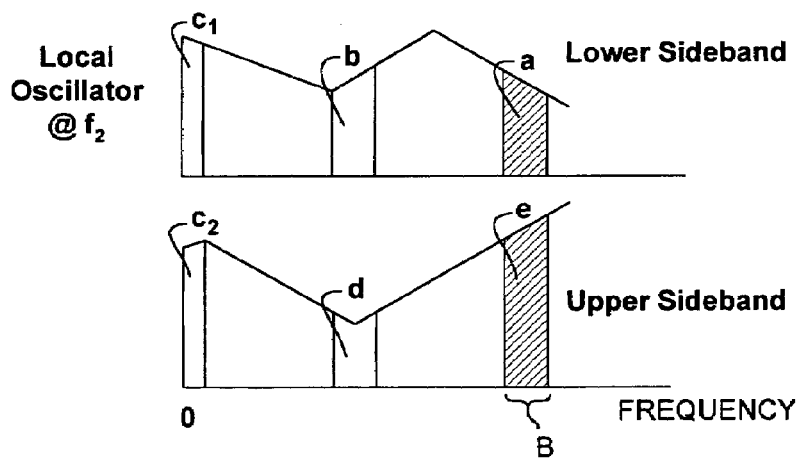
Figure 4D:
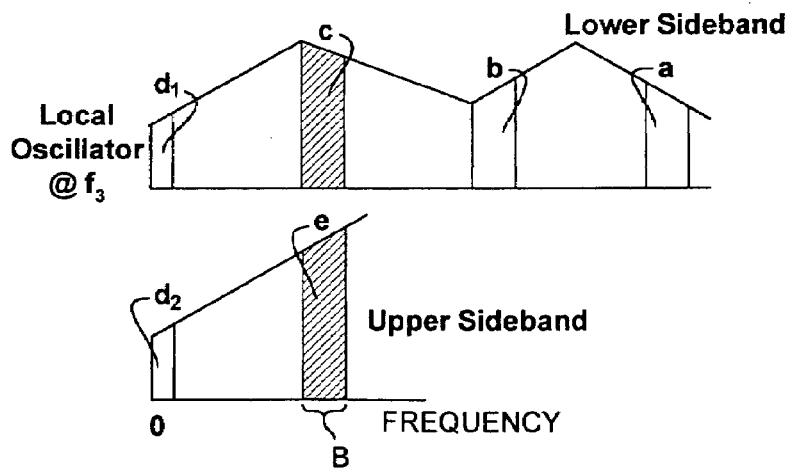
Figure 5:
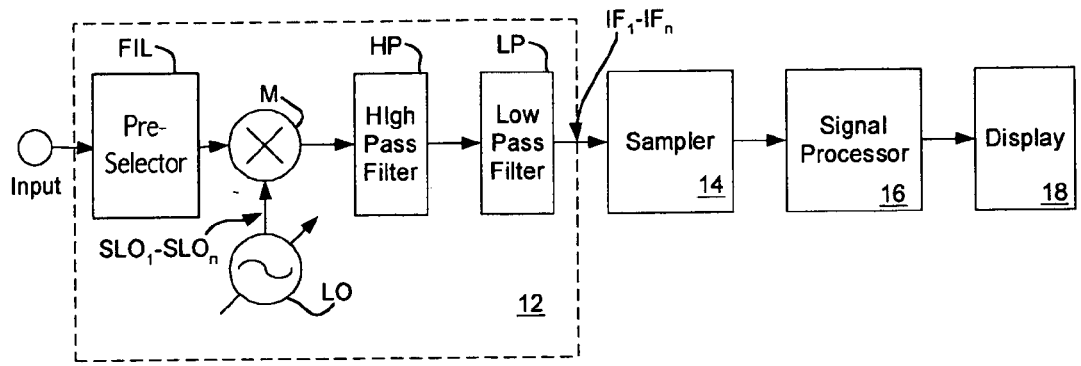
FIG. 5 shows a noise measurement system according to embodiments of the present invention.
Figure 6A:
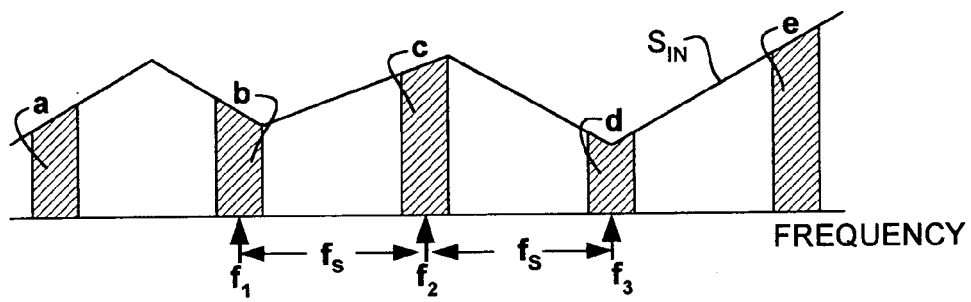
FIGS. 6A–6D show noise spectra associated with the noise measurement system of FIG. 5.

FIG. 6A shows an exemplary signal $S_{IN}$ with a series of frequency bands a–e designated within the spectrum of the signal $S_{IN}$. A noise measurement system 10 and noise measurement method 20 according to embodiments of the present invention measure noise power within one or more of the frequency bands a–e. The noise measurement system 10 (shown in FIG. 5) includes a frequency converter 12 cascaded with a sampler 14 and a signal processor 16. A display 18 or other output device optionally coupled to the signal processor 16 enables the noise power measured by the noise measurement system 10 to be displayed.

The frequency converter 12 typically includes a preselector FIL, a mixer M, a local oscillator LO, and output filters HP, LP. The preselector FIL limits the bandwidth of the signal $S_{IN}$ prior to application to the mixer M to reduce the effect of higher order mixing products that cause unwanted noise sidebands to fall within the bandwidth of intermediate frequency signals $IF_1$–$IF_n$ at the output of the frequency converter 12. In this example, the mixer M is a double-balanced mixer. However, any other suitable frequency translation device is alternatively used in the frequency converter 12.

The local oscillator LO is any suitable signal source capable of providing a succession of local oscillator signals $SLO_1$–$SLO_n$ to the mixer M, wherein each of the local oscillator signals has a frequency belonging to a designated set of equally-spaced frequencies $f_1$–$f_n$. In a typical implementation, the local oscillator LO is signal source that can be stepped in frequency, or a comb generator with an adjustable filter that provides the local oscillator signal $SLO_1$–$SLO_n$ successively at each of the frequencies $f_1$–$f_n$.

The output filter HP is a high pass filter that filters close-in noise from the local oscillator LO that gets translated by the mixer M into the frequency range of the intermediate frequency signals $IF_1$–$IF_n$. The output filter LP is typically a low pass filter that limits the bandwidth of each of the intermediate frequency signals $IF_1$–$IF_n$ present at the output of the frequency converter 12 to prevent aliasing when the intermediate frequency signals are each sampled by the sampler 14.

The sampler 14 is an analog-to-digital (A-to-D) converter, signal digitizer or other type of sampling system suitable for sampling each of the intermediate frequency signals $IF_1$–$IF_n$ at the output of the frequency converter 12. The signal processor 16, in this example implemented with a digital signal processor (DSP), processes the samples of the intermediate frequency signals $IF_1$–$IF_n$ acquired by the sampler 14 to determine the noise power in one or more of the frequency bands a–e within the signal $S_{IN}$.

Figure 6B:
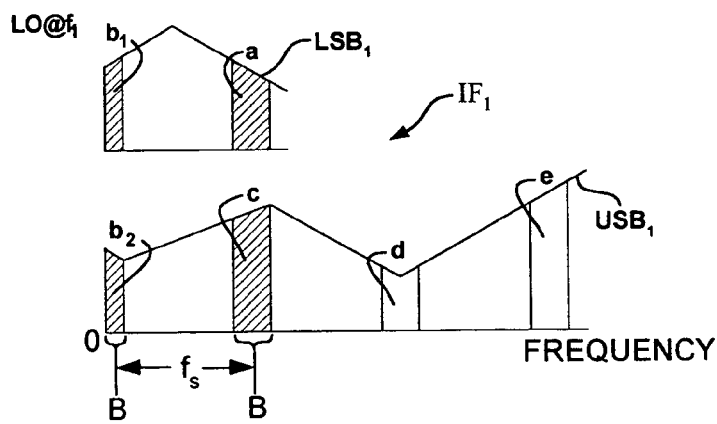
Figure 6C:
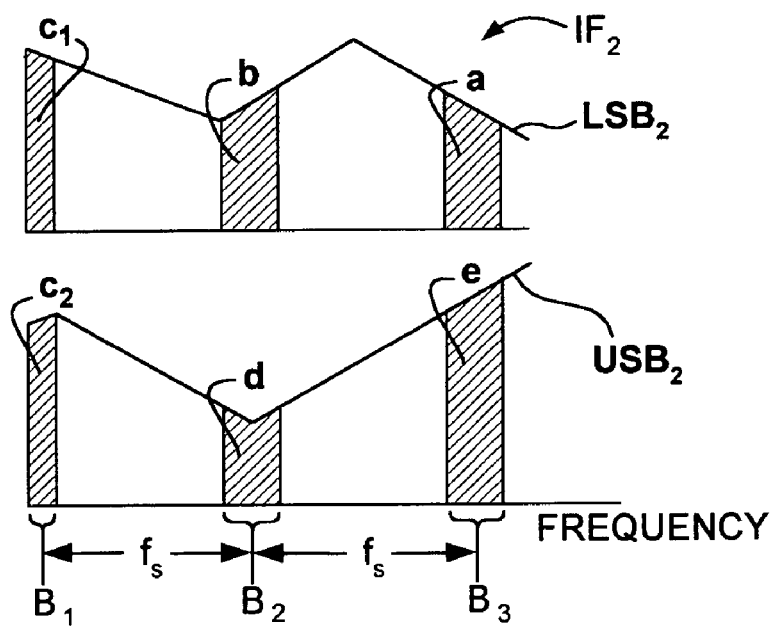
Figure 6D:
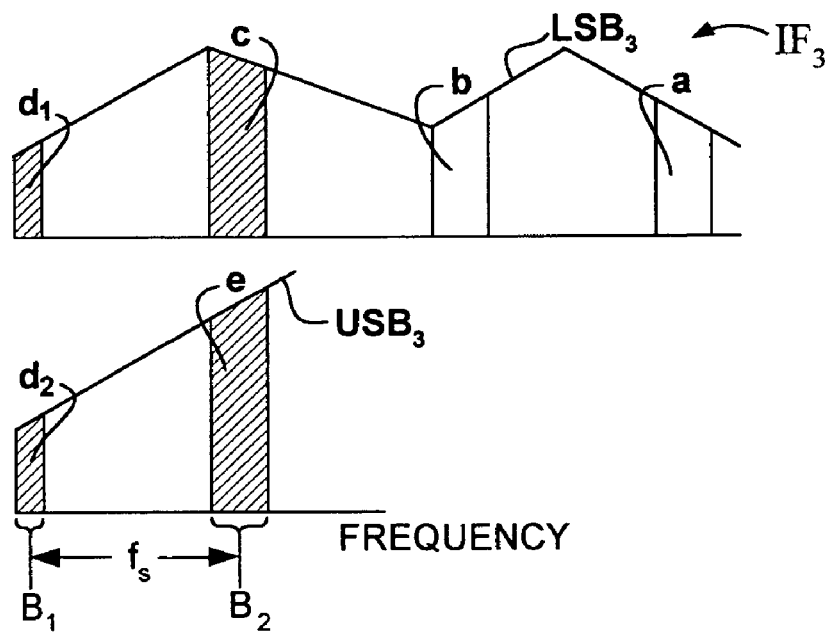

To determine the noise power within a designated frequency band within the signal SIN, the frequency converter 12 frequency translates the signal $S_{IN}$ to provide the intermediate frequency signals $IF_1$–$IF_N$ at the input to the sampler 14. This frequency translation includes mixing the signal $S_{IN}$ with each of the local oscillator signals $SLO_1$–$SLO_n$. The local oscillator signals $SLO_1$–$SLO_n$, having the corresponding frequencies $f_1$–$f_n$, are separated by a frequency spacing $f_s$. FIGS. 6B, 6C, 6D show examples of three intermediate frequency signals $IF_1$–$IF_n$ that result at the output of the frequency converter 12 when the signal $S_{IN}$ is translated by three equally-spaced frequencies f1–f3. The resulting intermediate frequency signals $IF_1$–$IF_3$ each include a superposition of overlapping upper and lower spectral sidebands. The upper sidebands $USB_x$ and lower sidebands $LSB_x$, though overlapping, are shown vertically offset from each other in FIGS. 6B–6D.

Noise of each of the intermediate frequency signals, for example intermediate frequency signals $IF_1$–$IF_3$, is measured in two or more measurement bands $B_1$–$B_k$ defined within the spectrum of each of the intermediate frequency signals $IF_1$–$IF_3$. The measurement bands $B_1$–$B_K$ are each separated by the frequency spacing $f_s$ that separates the frequencies $f_1$–$f_n$. To measure the noise of the intermediate frequency signals, the sampler 14 acquires samples of each of the intermediate frequency signals at a sufficiently high sampling rate to accommodate signal bandwidths that are wider than the frequency spacing $f_s$ of the local oscillator signals $SLO_1$–$SLO_n$. Particularly, the sampling rate of the sampler 14 is suitably high to satisfy the Nyquist criteria for the two or more defined measurement bands $B_1$–$B_K$ when separated by the frequency spacing $f_s$. These measurement bands $B_1$–$B_K$ are defined in the intermediate frequency signals $IF_1$–$IF_n$ either by filtering the intermediate frequency signals prior to the sampling by the sampler 14, or by digital filtering or other signal processing of the samples that are acquired of the intermediate frequency signals $IF_1$–$IF_n$ by the sampler 14. Depending on the frequencies $f_1$–$f_n$ of the local oscillator signals $SLO_1$–$SLO_n$, various frequency bands a–e of the signal $S_{IN}$ overlap within two or more of the measurement bands $B_1$–$B_K$.

FIG. 6B shows the spectrum of the intermediate frequency signal $IF_1$ that results at a time t1 when the local oscillator LO providing the local oscillator signal $SLO_1$ has a frequency $f_1$. Noise components b1 and b2 of the frequency band b in the signal $S_{IN}$ are shown overlapping within a measurement band $B_1$ in the intermediate frequency signal $IF_1$. Frequency bands a and c in the signal $S_{IN}$ overlap within the measurement band $B_2$ in the intermediate frequency signal $IF_1$. Measuring the overlapping noise components b1, b2 in the measurement band $B_1$, results in the noise measurement $M_b$. Measuring noise of the overlapping frequency bands a and c in the measurement band $B_2$ results in a noise measurement $M_{ac}=N_a+N_c$. The noise measurement $M_{ac}$ represents the sum of the noise power $N_a$ in the frequency band a translated to a lower sideband $LSB_1$ in the intermediate frequency signal $IF_1$, and the noise power $N_c$ in the frequency band c translated to an overlapping upper sideband $USB_1$ of the intermediate frequency signal $IF_1$.

FIG. 6C shows the spectrum of the intermediate frequency signal $IF_2$ that results when the local oscillator LO providing the local oscillator signal $SLO_2$ has a frequency $f_2$. Noise components c1 and c2 of the frequency band c in the signal $S_{IN}$ are shown overlapping within a measurement band $B_1$ in the intermediate frequency signal $IF_2$. Frequency bands b and d in the signal $S_{IN}$ overlap within the measurement band $B_2$ in the intermediate frequency signal $IF_2$. Frequency bands a and e in the signal $S_{IN}$ overlap within the measurement band $B_3$ in the intermediate frequency signal $IF_2$. Measuring overlapping noise components c1, c2 in the measurement band $B_1$ results in the noise measurement $M_c$. Measuring noise of the overlapping frequency bands b and d in the measurement band $B_2$ results in a noise measurement $M_{bd}=N_b+N_d$. The noise measurement $M_{bd}$ represents the sum of the noise power $N_b$ in the frequency band b translated to a lower sideband $LSB_2$ in the intermediate frequency signal $IF_2$, and the noise power $N_d$ in the frequency band d translated to an overlapping upper sideband $USB_2$ of the intermediate frequency signal $IF_2$. Measuring noise of the overlapping frequency bands a and e in the measurement band $B_3$ results in a noise measurement $M_{ae}=N_a+N_e$. The noise measurement $M_{ae}$ represents the sum of the noise power $N_a$ in the frequency band a translated to a lower sideband $LSB_2$ in the intermediate frequency signal $IF_2$, and the noise power $N_e$ in the frequency band e translated to an overlapping upper sideband $USB_2$ of the intermediate frequency signal $IF_2$.

FIG. 6D shows the spectrum of the intermediate frequency signal $IF_3$ that results when the local oscillator LO providing the local oscillator signal $SLO_3$ has a frequency $f_3$. Noise components d1 and d2 of the frequency band d in the signal $S_{IN}$ are shown overlapping within a measurement band $B_1$ in the intermediate frequency signal $IF_3$. Frequency bands c and e in the signal $S_{IN}$ overlap within the measurement band $B_2$ in the intermediate frequency signal $IF_3$. Measuring the overlapping noise components d1, d2 in the measurement band $B_1$ results in the noise measurement $M_d$. Measuring noise of the overlapping frequency bands c and e in the measurement band $B_2$ results in a noise measurement $M_{ce}=N_c+N_e$. The noise measurement $M_{ce}$ represents the sum of the noise power $N_c$ in the frequency band e translated to a lower sideband $LSB_3$ in the intermediate frequency signal $IF_3$, and the noise power $N_e$ in the frequency band e translated to an overlapping upper sideband $USB_3$ of the intermediate frequency signal $IF_3$.

The noise power in one or more of the frequency bands a–e of the signal $S_{IN}$ is determined by the signal processor 16 based on the noise measurements. In this example, the noise power determination is facilitated by expressing the relationship between the noise measurements $M_b$, $M_c$, $M_d$, $M_{ac}$, $M_{bd}$, $M_{ae}$, $M_{ce}$, and the noise powers $N_a$, $N_b$, $N_c$, $N_d$, $N_e$ in the frequency bands a–e, in a matrix equation 1.

$$\begin{bmatrix} 01000 \\ 00100 \\ 00010 \\ 10100 \\ 01010 \\ 10001 \\ 00101 \end{bmatrix} * \begin{bmatrix} N_a \\ N_b \\ N_c \\ N_d \\ N_e \end{bmatrix} = \begin{bmatrix} M_b \\ M_c \\ M_d \\ M_{ac} \\ M_{bd} \\ M_{ae} \\ M_{ce} \end{bmatrix} \quad (1)$$

In an alternative notation, Equation 1 is expressed by the matrix equation [H]*[N]=[M]. Applying the least squares method, described for example in by Charles W. Therrien, *Discrete Random Signals and Statistical Signal Processing*, pages 518–523, ISBN 0-13-852112-3, herein incorporated by reference, to the matrix equation 1 leads to the solution for the noise power matrix [N] in equation 2, where $[H]^T$ is the transpose of the matrix [H].

$$[N] = \{[H]^{T*}[H]\}^{-1} *[H]^{T*}[M] \quad (2)$$

This solution for the noise power matrix [N] is expressed explicitly in equation 3 for the example where the set of frequencies $f_1$–$f_n$ is made up of the three frequencies $f_1$, $f_2$, $f_3$.

$$\begin{bmatrix} N_a \\ N_b \\ N_c \\ N_d \\ N_e \end{bmatrix} = \left(\frac{1}{21}\right) \begin{bmatrix} -3Mc + 12Mac + 9Mae - 9Mce \\ 14Mb - 7Md + 7Mbd \\ 9Mc + 6Mac - 6Mae + 6Mce \\ -7Mb + 14Md + 7Mbd \\ -3Mc - 9Mac + 9Mae + 12Mce \end{bmatrix} \quad (3)$$

From equation 3, the noise power in one or more of the frequency bands a–e of the signal $S_{IN}$ is readily available. For example, the noise power in the frequency band c of the signal $S_{IN}$ is expressed in terms of the measured powers as follows:

$$N_c = \frac{6M_{ac} - 6M_{ae} + 9M_c + 6M_{ce}}{21} = \frac{2M_{ac} - 2M_{ae} + 3M_c + 2M_{ce}}{7}.$$

While the noise power is determined within the frequency band c of the signal $S_{IN}$ for the purpose of illustration, the noise power can also be determined in other frequency bands within the signal $S_{IN}$.

Due to the random nature of noise in the signal $S_{IN}$, the noise power (for example $N_c$) provides a measure of the statistics of the noise in the frequency band c. The measured noise expressed in the matrix [M] is also a random variable and the variance of the noise measurements in the matrix [M] provides a measure of uncertainty in the noise measurements. In an exemplary noise measurement, where the noise measurements are performed with the local oscillator signals $SLO_1$–$SLO_3$ at the frequencies $f_1$–$f_3$, the variance of the noise measurement $M_b$ is 1.56, the variance of the noise measurement $M_c$ is 1.35 and the variance of the noise measurement $M_d$ is 1.56, where each of these variances is normalized to the variance that results when a conventional noise figure meter is used to determine the noise power within a designated frequency band of the signal $S_{IN}$.

Figure 8:
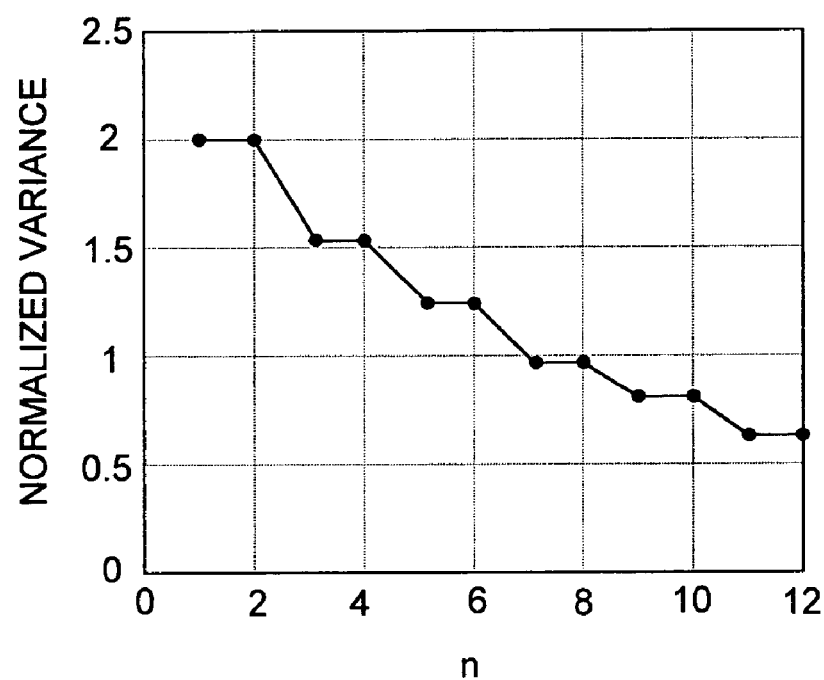
FIG. 8 shows a plot of measurement accuracy of the noise measurement system and noise measurement method according to the embodiments of the present invention.

The noise power in this example has been determined based on the frequency translation of the signal $S_{IN}$ by three frequencies $f_1$–$f_3$ for the purpose of illustration. When more than the three local oscillator frequencies $f_1$–$f_3$ are used in the frequency translations and when frequency bands in addition to the frequency bands a–e are designated in the signal $S_{IN}$, the accuracy of the noise power measurements increases. FIG. 8 shows the resulting increase in measurement accuracy, depicted as a decrease in normalized measurement variance, as the number n of local oscillator frequencies $f_1$–$IF_n$ increases.

Figure 7:
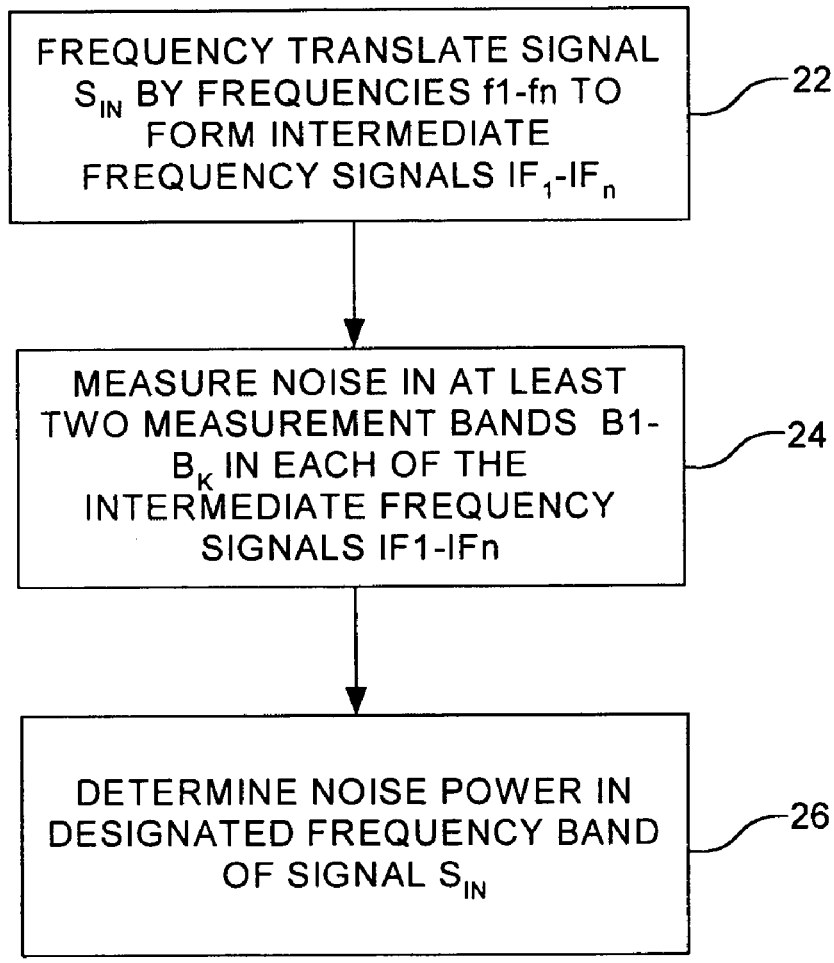
FIG. 7 shows a noise measurement method according to alternative embodiments of the present invention.

According to alternative embodiments of the present invention, noise power is determined by a noise measurement method 20 shown in the flow diagram of FIG. 7. The noise measurement method 20, which includes steps 22–26, determines the noise power within one or more of the designated frequency bands a–e of the signal $S_{IN}$. Step 22 includes frequency translating the signal $S_{IN}$ by the set of equally spaced frequencies $f_1$–$f_n$ to form the intermediate frequency signals $IF_1$–$IF_n$, frequency translating typically includes mixing the signal $S_{IN}$ with each of the local oscillator signals $SLO_1$–$SLO_n$.

Step 24 includes measuring the noise in the two or more measurement bands $B_1$–$B_K$ within each of the intermediate frequency signals $IF_1$–$IF_n$ that are separated by the frequency spacing $f_s$ of the equally spaced frequencies $f_1$–$f_n$. The noise measurement includes acquiring samples of each of the intermediate frequency signals $IF_1$–$IF_n$ at a sufficiently high sampling rate to accommodate signal bandwidths of the two or more defined measurement bands $B_1$–$B_K$ that are separated by the frequency spacing $f_s$. The measurement bands $B_1$–$B_K$ are defined in the intermediate frequency signals $IF_1$–$IF_n$ either by filtering the intermediate frequency signals prior to the sampling by the sampler 14, or by digital filtering or other signal processing of the samples that are acquired of the intermediate frequency signals $IF_1$–$F_n$ by the sampler 14. In step 26, noise power in the designated frequency band of the signal $S_{IN}$ is determined based on the noise measurements performed in step 24. In one example, the noise power in one or more designated frequency bands of the signal $S_{IN}$ is determined by solution of the matrix equation 1 and by application of the least square method.

While the embodiments of the present invention have been illustrated in detail, it should be apparent that modifications and adaptations to these embodiments may occur to one skilled in the art without departing from the scope of the present invention as set forth in the following claims.

The invention claimed is:

1. A system for measuring noise within a designated frequency band of an applied signal, comprising:
   a frequency converter frequency translating the applied signal by a set of equally spaced frequencies to provide a corresponding set of intermediate frequency signals;
   a sampler measuring the noise in at least two measurement bands of each of the intermediate frequency signals that are separated by the frequency spacing of the equally spaced frequencies; and
   a signal processor determining the noise power in the frequency band of the applied signal based on the noise measured by the sampler by solving a matrix equation resulting from the noise measured in the at least two measurement bands of each of the intermediate frequency signals and applying the least squares method.

2. The system of claim 1 wherein measuring the noise in the at least two measurement bands of each of the intermediate frequency signals that are separated by the frequency spacing of the equally spaced frequencies includes sampling each of the intermediate frequency signals.

3. The system of claim 2 wherein the at least two measurement bands are defined by filtering each of the intermediate frequency signals prior to sampling each of the intermediate frequency signals.

4. The system of claim 2 wherein the at least two measurement bands of each of the intermediate frequency signals are defined by sampling each of the intermediate frequency signals and digitally filtering samples acquired from the sampling.

5. The system of claim 2 wherein the at least two measurement bands of each of the intermediate frequency signals include an upper sideband and a lower sideband that are overlapping.

6. The system of claim 1 wherein the frequency converter includes a preselector limiting the bandwidth of the applied signal, a mixer having a first port coupled to the preselector, a cascaded high pass filter and a low pass filter interposed between a second port of the mixer and the sampler, wherein a third port of the mixer receives a local oscillator signal having at successive times the frequencies in the set of equally spaced frequencies.

7. The system of claim 1 wherein the at least two measurement bands of each of the intermediate frequency signals include an upper sideband and a lower sideband that are overlapping.

8. The system of claim 1 wherein frequency translating the applied signal by the set of equally spaced frequencies to provide the corresponding set of intermediate frequency signals includes mixing the applied signal with a local oscillator signal having at successive times the frequencies in the set of equally spaced frequencies.

9. A method for measuring noise within a frequency band of an applied signal, comprising:
   (a) frequency translating the applied signal by a set of equally spaced frequencies to form a corresponding set of intermediate frequency signals;
   (b) measuring the noise in at least two measurement bands of each of the intermediate frequency signals that are separated by the frequency spacing of the equally spaced frequencies; and
   (c) determining the noise power in the frequency band of the applied signal based on the noise measured in (b) by solving a matrix equation resulting from the noise measurements in (b) and applying the least squares method.

10. The method of claim 9 wherein (a) includes mixing the applied signal with a local oscillator signal having at successive times the frequencies in the set of equally spaced frequencies.

11. The method of claim 10 wherein (b) includes sampling each of the intermediate frequency signals.

12. The method of claim 11 wherein the at least two measurement bands are defined by filtering each of the intermediate frequency signals prior to sampling each of the intermediate frequency signals.

13. The method of claim 9 wherein (b) includes sampling each of the intermediate frequency signals.

14. The method of claim 13 wherein the at least two measurement bands are defined by filtering each of the intermediate frequency signals prior to sampling each of the intermediate frequency signals.

15. The method of claim 9 wherein the at least two measurement bands are defined by sampling each of the intermediate frequency signals and digitally filtering samples acquired from the sampling.

16. The method of claim 9 wherein the at least two measurement bands of each of the intermediate frequency signals are defined by filtering the intermediate frequency signals in the set.

17. The method of claim 9 wherein the at least two measurement bands in each of the intermediate frequency signals each include an upper sideband and a lower sideband that are overlapping.

* * * * *

UNITED STATES PATENT AND TRADEMARK OFFICE
CERTIFICATE OF CORRECTION

| | | |
|---|---|---|
| PATENT NO. | : 7,010,443 B2 | Page 1 of 1 |
| APPLICATION NO. | : 10/699526 | |
| DATED | : March 7, 2006 | |
| INVENTOR(S) | : Torin et al. | |

It is certified that error appears in the above-identified patent and that said Letters Patent is hereby corrected as shown below:

On the title page, in item (56), under "Foreign Patent Documents", in column 2, line 1, after "2/1991" insert -- H03J/05/00 --.

In column 8, line 11, in Claim 11, delete "claim 10wherein" and insert -- claim 10 wherein --, therefor.

Signed and Sealed this

Eighth Day of August, 2006

JON W. DUDAS
*Director of the United States Patent and Trademark Office*